US005973925A

United States Patent [19]

Kraemer

[11] Patent Number: 5,973,925

[45] **Date of Patent: *Oct. 26, 1999**

[54] PCMCIA MODEM CONNECTION PROTECTOR

[76] Inventor: Gordon A. Kraemer, 5429 Montgomery Dr., Greendale, Wis. 53129

[ * ] Notice: This patent issued on a continued prosecution application filed under 37 CFR 1.53(d), and is subject to the twenty year patent term provisions of 35 U.S.C. 154(a)(2).

[21] Appl. No.: 08/908,114

[22] Filed: Aug. 11, 1997

Related U.S. Application Data

[63] Continuation of application No. 08/908,114, Aug. 11, 1997, abandoned.

[60] Provisional application No. 60/022,876, Aug. 20, 1996.

[51] Int. Cl.[6] .............................. H05K 1/14; H01R 23/02

[52] U.S. Cl. ........................... 361/737; 439/946; 361/683

[58] Field of Search ................................ 439/946, 946.2, 439/928.1, 136, 76.1, 942, 374; 361/737, 683

[56] References Cited

U.S. PATENT DOCUMENTS

| | | | |
|---|---|---|---|
| 4,066,313 | 1/1978 | von dem Hagen | 339/75 P |
| 4,662,697 | 5/1987 | Moses | 339/38 |
| 5,667,395 | 9/1997 | Okada et al. | 439/131 |
| 5,769,646 | 6/1998 | Cavello et al. | 439/136 |

*Primary Examiner*—Leo P. Picard
*Assistant Examiner*—Jayprakash N. Gandhi
*Attorney, Agent, or Firm*—Joseph S. Heino

[57] ABSTRACT

A PCMCIA accessory card is provided which can be inserted into the lower PCMCIA card slot of a lap top computer to protect the PCMCIA card's connections when the PCMCIA card is plugged into the upper card slot of the lap top computer.

5 Claims, 1 Drawing Sheet

PCMCIA MODEM CONNECTION PROTECTOR

This application is a continuation of application Ser. No. 08/908,114, filed Aug. 11, 1997, now abandoned. This application claims the benefit of U.S. Provisional Application Ser. No. 60/022,876, filed Aug. 20, 1996.

FIELD OF THE INVENTION

This invention relates generally to portable lap top computers. More particularly, it relates to an accessory apparatus which is intended to be used with lap top computers that are equipped with PCMCIA card slots for facsimile transmission and modem capabilities and which is intended to protect the connections of the PCMCIA card when it is inserted into the card slot.

BACKGROUND OF THE INVENTION

The evolution of the computer has led to the technologically natural progression of making computers, and accessories for computers, smaller and more compact while making them more powerful and more versatile. This evolution has also led to the popularity enjoyed by any number of commercially available lap top computers and their accessories. And today's lap top computers enjoy most, if not all, of the features that their desk top counterparts possess. They can even communicate with other computers and data banks via accessory modem devices known as PCMCIA cards. The PCMCIA card is the hardware interface between the computer and the telephone line through which the computer and its user communicates.

Most current models of lap top computers have dual card slots built into them for receiving PCMCIA cards. In the experience of this inventor, however, the PCMCIA card is in a very precarious position when the lap top computer is used as intended. That is, the PCMCIA card typically slides into a slot which is situated to one side (typically to the user's left) of the main body of the lap top computer. Although the body of the PCMCIA card slides well into and is protected by the main body of the computer, the PCMCIA card's connector, which is most usually external of the lap top computer's main body, is quite vulnerable to damage. In this inventor's experience, the PCMCIA connector may be damaged or broken off altogether by the user's unintentional josttling of the lap top computer.

SUMMARY OF THE INVENTION

It is, therefore, a principal object of this invention to provide a new, useful and uncomplicated lap top computer accessory apparatus which protects the PCMCIA card's connections while the PCMCIA card is plugged into the lap top computer's card slot. It is a further object of this invention to provide such an apparatus which requires only a minimal number of elements and which requires only a minimal number of steps to utilize.

The present invention has obtained these objects. It provides for an accessory card which can be inserted into a lower PCMCIA card slot to protect the PCMCIA card's connections when the PCMCIA card is plugged into an upper card slot. The foregoing and other features of the device of the present invention will be further apparent from the description which follows.

DETAILED DESCRIPTION

Figure 1:
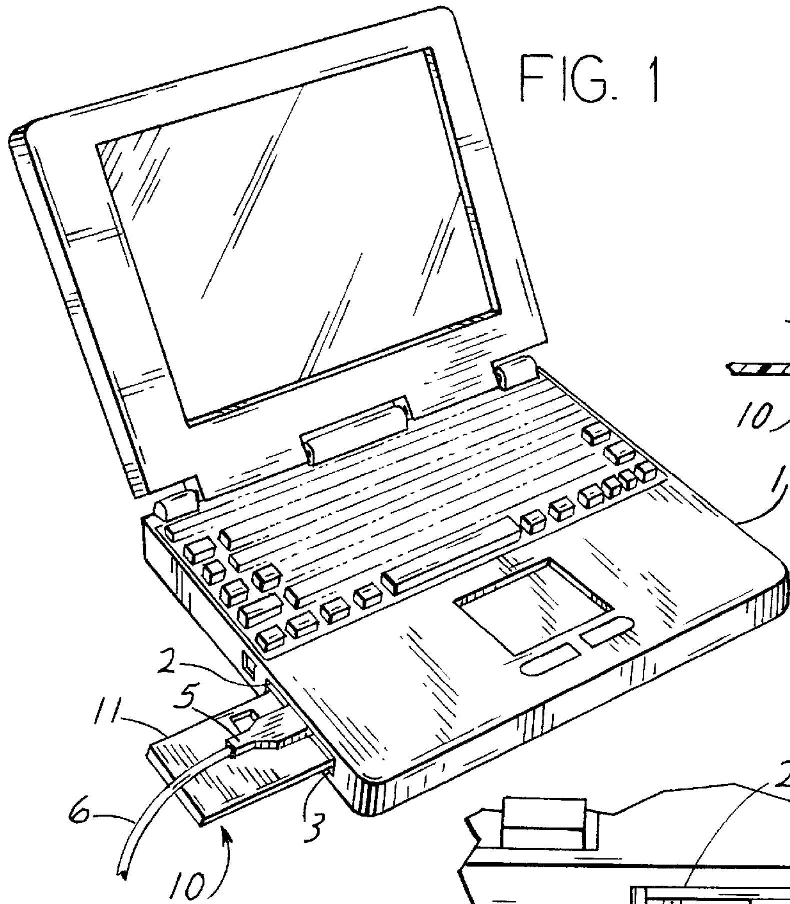
FIG. 1 is a front perspective view of a lap top computer utilizing the device of the present invention.
Figure 3:
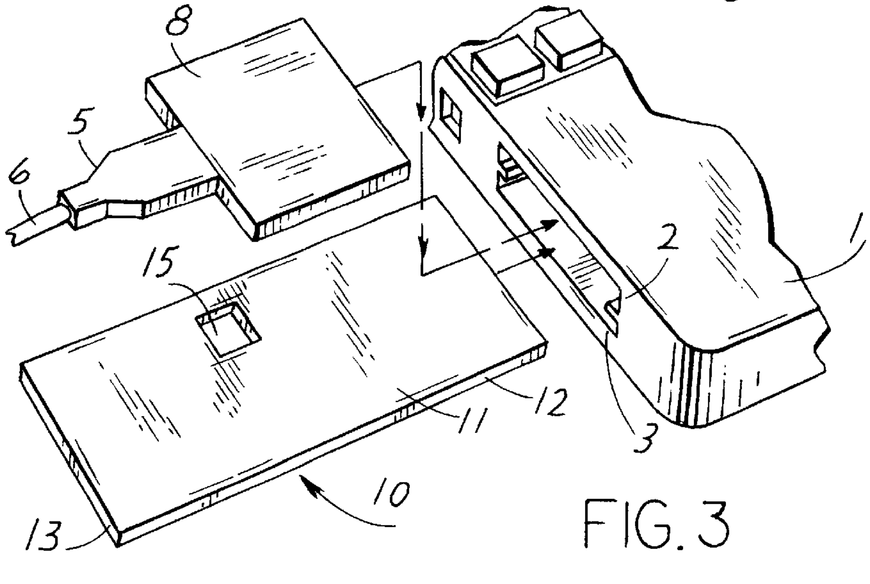
FIG. 3 is an exploded perspective view of the card slot and accessories shown in FIG. 2.

Referring now to the drawings in detail, FIG. 1 shows a typical lap top computer 1. The lap top computer 1 has, as a built-in accessory, an upper PCMCIA card slot 2 which is functionally adapted to receive a PCMCIA card 8 into the card slot 2. See FIG. 3. Situated immediately below the upper PCMCIA card slot 2, and in complimentary overlapping position relative to it, is a second accessory item, a lower PCMCIA card slot 3. This lower card slot 3 is likewise functionally adapted to receive a PCMCIA card 8 into it.

Figure 2:
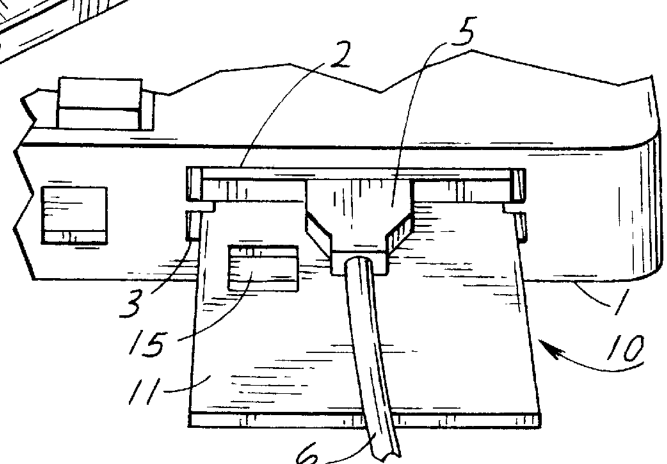
FIG. 2 is an enlarged side view showing the details of the card slot of the lap top computer shown in FIG. 1.

The typical PCMCIA card 8 includes a card connector 5 and a cable 6. See FIGS. 2 and 3. The PCMCIA card cable 6 has, at its other end (not shown), a telephone jack connector which allows the PCMCIA card 8 to be plugged into virtually any conventional telephone jack.

In the preferred embodiment of the device of the present invention, a PCMCIA card connection protector, generally identified 10, is provided. The PCMCIA card connector protector 10 includes a protector body 11 having a leading edge 12 and a trailing edge 13. For unique applications, which will be explained further in this detailed description, an opening 15 is provided in the protector body 11. The leading edge 12 of the protector 10 is that which is intended to be inserted into the card slot 3. The trailing edge 13 is that which is intended to be grasped by the user when insertion of the protector 10 is desired or required. The trailing edge 13 of the protector 10 is also that portion which extends to the exterior of the copmputer and provides the protection function of the device.

Figure 4:
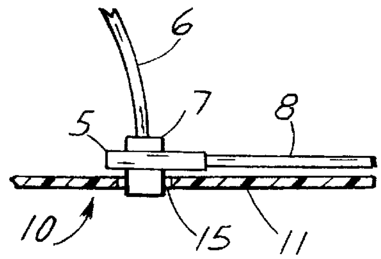
FIG. 4 is side elevational and cross sectional view of one embodiment of the present invention.

In application, the user inserts the PCMCIA card 8 into the upper card slot 2, connects the connector 5 and the cable 6 to the card 8 and then plugs the phone jack end of the cable (not shown) into a conventional phone jack. The user then grasps the protector 10 by its trailing edge 13 and inserts it into the lower card slot 3. The protector remains in theis position until the user concludes his or her modem activity at which time the reverse of this procedure is followed. In the case of those commercially available PCMCIA cards 8 which have connectors 5 which create a 90° bend or elbow (see FIG. 4), the protector 10 is provided with an access opening 15 through which the connector 5 extends. The application of this variation may require that the protector 10 be inserted into the upper card slot 2 prior to the connector 5 being attached to the PCMCIA card.

From the foregoing detailed description of the illustrative embodiment of the invention set forth herein, it will be apparent that there has been provided a new, useful and uncomplicated lap top computer accessory apparatus which protects the PCMCIA card's connections while the PCMCIA card is plugged into the lap top computer's card slot which requires only a minimal number of elements and which requires only a minimal number of steps to utilize.

The principles of this invention having been fully explained in connection with the foregoing, I hereby claim:

1. In a lap top computer having at least two modem card slots prescribed by PCMCIA (Personal Computer Memory Card International Association) contained within it, said PCMCIA modem card slots being arranged in a stacked planar configuration with an upper PCMCIA card slot situated immediately above a lower PCMCIA card slot, both of such slots including a PCMCIA modem card therewithin, said PCMCIA modem card having external communication cord connection means connected to or integral with said PCMCIA modem card, a device for protecting the communication cord connection to a PCMCIA card situated within the upper PCMCIA card slot of the lap top computer which comprises a protector member, said protector member comprising a generally flat protector body which is dimensioned with the same width and with the same depth as a PCMCIA modem card, but which has a longitudinal dimension greater than that of a PCMCIA modem card, said protector body including a leading body edge forwardly of the protector body and a trailing edge rearwardly of the protector body, a protector member support means, said protector member support means including that leading edge of the protector body and further including a portion of the protector body rearwardly of said leading edge which extends inwardly of said lap top computer when the protector member is fully inserted into the lower PCMCIA modem card slot of the lap top computer, and a protector member extension means, said protector member extension means including the trailing edge of the protector body and further including that portion of the protector body forwardly of said trailing edge which extends outwardly of said lap top computer from the lower PCMCIA card slot of the lap top computer when the protector member is fully inserted into the lower PCMCIA modem card slot of the lap top computer for protecting the communication cord connection of the PCMCIA card when the PCMCIA card in inserted into the upper PCMCIA card slot of the lap top computer.

2. The device of claim 1 wherein said protector body further includes an aperture, said aperture being situated within that portion of the protector body which extends outwardly of the lap top computer for receiving a portion of a jack plug therewithin, said jack plug being attachable to the PCMCIA card communication cord connection means when the card is located within the upper PCMCIA card slot of the lap top computer.

3. In a lap top computer having a pair of stacked modem card slots defined therewithin, said modem card slots being prescribed by PCMCIA (Personal Computer Memory Card International Association) and including a top slot and a bottom slot and further including a PCMCIA modem card therewithin, said PCMCIA modem card having an external communication connection connected to or integral with the card, a device for protecting the external communication connection of a PCMCIA modem card inserted into the top slot which comprises a protector member, said protector member comprising a generally flat protector body, a protector member leading edge, said protector member leading edge being insertable within the PCMCIA modem card slots of said lap top computer, and a protector member trailing edge, said protector member trailing edge being graspable by a user for inserting the protector member into, and for removing the protector member from, the PCMCIA modem card slot with which it is to be used, said trailing edge extending outwardly from the lap top computer.

4. The protecting device of claim 3 wherein said protector body is dimensioned with the same width and with the same depth as a PCMCIA modem card, but which has a longitudinal dimension greater that that of a PCMCIA modem card.

5. The protecting device of claim 4 wherein said protector member trailing edge further includes an aperture, said aperture being configured so as to receive a portion of a jack plug therewithin when the PCMCIA modem card is located within the top card slot of the lap top computer.

* * * * *